United States Patent
Lee et al.

(10) Patent No.: US 7,510,935 B2
(45) Date of Patent: Mar. 31, 2009

(54) METHOD OF MANUFACTURING A CHARGE-TRAPPING DIELECTRIC AND METHOD OF MANUFACTURING A SONOS-TYPE NON-VOLATILE SEMICONDUCTOR DEVICE

(75) Inventors: Sung-Hae Lee, Gyeonggi-do (KR); Ju-Wan Lim, Seoul (KR); Jae-Young Ahn, Gyeonggi-do (KR); Sang-Ryol Yang, Gyeonggi-do (KR); Ki-Hyun Hwang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 285 days.

(21) Appl. No.: 11/468,944

(22) Filed: Aug. 31, 2006

(65) Prior Publication Data
US 2007/0048957 A1  Mar. 1, 2007

(30) Foreign Application Priority Data
Aug. 31, 2005  (KR)  ...................... 10-2005-0080525

(51) Int. Cl.
*H01L 21/8247* (2006.01)
(52) U.S. Cl. .............................. 438/261; 257/E21.179; 438/954
(58) Field of Classification Search ......... 438/257–267, 438/954; 257/E21.179
See application file for complete search history.

(56) References Cited

U.S. PATENT DOCUMENTS 5,981,403 A * 11/1999 Ma et al. .................... 438/758
6,268,299 B1 * 7/2001 Jammy et al. ............... 438/791
6,501,681 B1    12/2002 Van Buskirk et al.
6,642,573 B1 * 11/2003 Halliyal et al. .............. 257/316

FOREIGN PATENT DOCUMENTS

| JP | 5-145078 | 6/1993 |
| JP | 2002-217317 | 8/2002 |
| KR | 10-0426817 | 3/2004 |

OTHER PUBLICATIONS

English language abstract of Japanese Publication No. 5-145078.
English language abstract of Japanese Publication No. 2002-217317.
English language abstract of Korean Publication No. 10-0426817.

* cited by examiner

*Primary Examiner*—Richard A. Booth
(74) *Attorney, Agent, or Firm*—Marger Johnson & McCollom, P.C.

(57) ABSTRACT

In an embodiment, a method of manufacturing a charge-trapping dielectric and a silicon-oxide-nitride-oxide-silicon (SONOS)-type non-volatile semiconductor device includes forming the charge-trapping dielectric, and a first oxide layer including silicon oxide. A silicon nitride layer including silicon-rich nitride is formed by a cyclic chemical vapor deposition (CVD) process using a silicon source material and a nitrogen source gas. A second oxide layer is formed on the silicon nitride layer. Hence, the charge-trapping dielectric having good erase characteristics is formed. In the SONOS-type non-volatile semiconductor device including the charge-trapping dielectric, a data erase process may be stably performed.

18 Claims, 9 Drawing Sheets

METHOD OF MANUFACTURING A CHARGE-TRAPPING DIELECTRIC AND METHOD OF MANUFACTURING A SONOS-TYPE NON-VOLATILE SEMICONDUCTOR DEVICE

CROSS-REFERENCE TO RELATED APPLICATIONS

This application claims priority under 35 USC § 119 to Korean Patent Application No. 2005-80525, filed on Aug. 31, 2005, the contents of which are herein incorporated by reference in their entirety.

BACKGROUND

1. Technical Field

This disclosure relates to a method of manufacturing a charge-trapping dielectric and a method of manufacturing a silicon-oxide-nitride-oxide-silicon (SONOS)-type non-volatile semiconductor device. More particularly, this disclosure relates to a method of manufacturing a charge-trapping dielectric including a silicon-rich nitride thin film and a method of manufacturing a SONOS-type non-volatile semiconductor device using the charge-trapping dielectric including the silicon-rich nitride thin film.

2. Description of the Related Art

In general, a non-volatile semiconductor device can be classified as either a floating gate type non-volatile semiconductor device or a floating trap type non-volatile semiconductor device. Particularly, the floating trap type non-volatile semiconductor device includes a silicon-oxide-nitride-oxide-silicon (SONOS)-type non-volatile semiconductor device.

The floating gate type non-volatile semiconductor device includes a tunnel oxide layer, a floating gate, a dielectric layer, and a control gate formed on a semiconductor substrate in a unit cell. The floating gate type non-volatile semiconductor device stores charges, which serve as free carriers, in the floating gate. If the tunnel oxide layer disposed between the floating gate and the semiconductor substrate has defects, all the charges stored in the floating gate may be lost. Thus, the tunnel oxide layer is relatively thick to prevent the charges from being lost from the tunnel oxide layer. However, a high operating voltage is needed for the above relatively thick layer, so that circuit compositions for applying the high operating voltage may become complicated. Therefore, the floating gate type non-volatile semiconductor device has limits with respect to the degree of integration.

The SONOS-type non-volatile semiconductor device includes a charge-trapping dielectric and a single electrode formed on the charge-trapping dielectric in a unit cell. The charge-trapping dielectric has a multilayer structure in which a first silicon oxide, a silicon nitride layer, and a second silicon oxide layer are formed. The SONOS-type non-volatile semiconductor device performs programming by a method of storing electrons in a trap formed in the charge-trapping dielectric positioned between the single electrode and the semiconductor substrate. The first silicon oxide layer may be relatively thin because the electrons are stored in a deep-level trap formed in the silicon nitride layer.

When the first silicon oxide layer is relatively thin, the SONOS-type non-volatile semiconductor device may be driven at a low operating voltage so that circuit compositions for applying the operating voltage may be simple. Therefore, the SONOS-type non-volatile semiconductor device has an advantage of having high-integration capability.

An example of the SONOS-type non-volatile semiconductor device is disclosed in U.S. Pat. No. 6,501,681. In the SONOS-type non-volatile semiconductor device, however, when the electrons stored in the silicon nitride layer are erased, the electrons may not be completely erased because the stored electrons do not completely move into the semiconductor substrate during the erasure. Particularly, while erasing the stored electrons, the stored electrons in the silicon nitride layer tunnel through the first silicon oxide layer to move into the semiconductor substrate by a Fowler-Nordheim tunneling process, but electrons created in the single electrode move into the silicon nitride layer through the second silicon oxide layer, so that the electrons may not be completely erased.

Additionally, a method of manufacturing the SONOS-type non-volatile semiconductor device is disclosed in Japanese Patent Laid-Open Publication No. 2002-217317. In the method of manufacturing the SONOS-type non-volatile semiconductor device, a silicon oxide ($SiO_2$) layer, which serves as a lower dielectric layer, is formed on a semiconductor substrate. Sequentially, a silicon nitride layer storing charges is formed on the silicon oxide layer by an atomic layer deposition (ALD) process using silane ($SiCl_4$) gas and hexachlorodisilane ($Si_2Cl_6$) gas. An upper dielectric layer and a gate electrode are formed on the silicon nitride layer to complete the SONOS-type non-volatile semiconductor device.

However, in the above-mentioned method of manufacturing the SONOS-type non-volatile semiconductor device, the silicon nitride layer is formed by the ALD process to reduce an incubation time of the silicon nitride layer and improve its interface characteristics. Thus, forming a silicon nitride layer having a high trap density is difficult. Additionally, because the silicon nitride layer is formed while a flow rate of ammonia gas is increased, the SONOS-type non-volatile semiconductor device has limits in being able to improve an erase speed, which is a speed of removing the trapped electrons in the silicon nitride layer. That is, because the silicon nitride layer does not contain silicon-rich nitride, the SONOS-type non-volatile semiconductor device has limits in its ability to improve the erase speed.

SUMMARY

Example embodiments provide a method of manufacturing a charge-trapping dielectric including silicon-rich nitride so that the charge-trapping dielectric may have a high electron trap density, and may allow electrons in the charge-trapping dielectric to be easily erased.

Example embodiments provide a method of manufacturing a silicon-oxide-nitride-oxide-silicon (SONOS)-type semiconductor device having the charge-trapping dielectric including silicon-rich nitride so that the charge-trapping dielectric may have the high electron trap density, and may allow electrons in the charge-trapping dielectric to be easily erased.

According to one aspect of the present invention, there is provided a method of manufacturing a charge-trapping dielectric. In the method of manufacturing the charge-trapping dielectric, a first oxide layer including silicon oxide is prepared. A silicon nitride ($Si_xN_y$) layer is formed on the first oxide layer by a cyclic chemical vapor deposition (CVD) process using a silicon source material and a nitrogen source gas. A composition ratio (x/y) of silicon with respect to nitrogen in the silicon nitride layer is in a range of about 0.7 to about 1.5. A second oxide layer is formed on the silicon nitride layer.

In an example embodiment, the composition ratio (x/y) of silicon with respect to nitrogen in the silicon nitride layer is in a range of about 0.85 to about 1.5.

In an example embodiment, the silicon source material may include one of hexachlorodisilane ($Si_2Cl_6$) and octachlorotrisilane ($Si_3Cl_8$).

In an example embodiment, the nitrogen source gas may include one of ammonia ($NH_3$) gas, amine ($RNH_2$) gas and a mixture thereof. Here, R may be an alkyl group.

In an example embodiment, the cyclic CVD process may be performed at a temperature of about 400° C. to about 700° C.

In an example embodiment, in the silicon nitride layer, when y is about 4.0, x is no less than 3, preferably in a range of about 3.0 to about 6.0, and more preferably in a range of about 3.5 to about 5.5.

In an example embodiment, in a formation of the silicon nitride layer, the silicon source material in a gaseous state may be introduced onto the first oxide layer. The silicon source material may be chemisorbed onto a surface of the first oxide layer. Residual silicon source material that is not chemisorbed onto the surface of the first oxide may be removed. The nitrogen source gas may be introduced onto the first oxide layer. A preliminary silicon nitride layer may be formed by a chemical reaction between the nitrogen source gas and the chemisorbed silicon source material.

In an example embodiment, the formation of the silicon nitride layer may be repeated at least five times.

In an example embodiment, the second oxide layer may include a metal oxide.

According to another aspect, there is provided a method of manufacturing a charge-trapping dielectric. In the method of manufacturing the charge-trapping dielectric, a first oxide layer including silicon oxide is prepared. A first silicon nitride ($Si_aN_b$) thin film is formed on the first oxide layer. A first composition ratio (a/b) of silicon with respect to nitrogen in the first silicon nitride thin film is in a range of about 0.7 to about 0.85. A second silicon nitride ($Si_cN_d$) thin film is formed on the first silicon nitride thin film by a cyclic CVD process using a silicon source material and a nitrogen source gas. A second composition ratio (c/d) of silicon with respect to nitrogen in the second silicon nitride thin film is in a range of about 0.85 to about 1.5. A second oxide layer is formed on the second silicon nitride thin film.

In an example embodiment, a thickness of the first silicon nitride thin film may be about 5% to about 60% of a total thickness of the first and second silicon nitride thin films.

In an example embodiment, a thickness of the second silicon nitride thin film may be about 40% to about 95% of the total thickness of the first and second silicon nitride thin films.

In an example embodiment, the method of manufacturing the charge-trapping dielectric may further include forming a third silicon nitride ($Si_xN_y$) thin film on the second silicon nitride thin film. A third composition ratio (x/y) of silicon with respect to nitrogen in the third silicon nitride thin film may be in a range of about 0.7 to about 0.85.

In an example embodiment of the present invention, the first and second silicon nitride thin films may be formed by an in-situ process.

According to still another aspect, there is provided a method of manufacturing a SONOS-type non-volatile semiconductor device. In the method of manufacturing the SONOS-type non-volatile semiconductor device, a first oxide layer including silicon oxide is formed on a semiconductor substrate. A silicon nitride ($Si_xN_y$) layer is formed on the first oxide layer by a cyclic CVD process using a silicon source material and a nitrogen source gas. A composition ratio (x/y) of silicon with respect to nitrogen in the silicon nitride layer is in a range of about 0.7 to about 1.5. A second oxide layer is formed on the silicon nitride layer. A conductive layer is formed on the second oxide layer. A gate structure including a charge-trapping dielectric and a conductive pattern on the charge-trapping dielectric is formed by sequentially etching the conductive layer, the second oxide layer, the silicon nitride layer and the first oxide layer. The charge-trapping dielectric has a multilayer structure in which a first oxide layer pattern, a silicon nitride layer pattern and a second oxide layer pattern are sequentially formed on the semiconductor substrate. Source/drain regions are formed at surface portions of the semiconductor substrate adjacent to the gate structure by doping impurities onto the substrate adjacent to the gate structure.

According to still another aspect, there is provided a method of manufacturing a SONOS-type non-volatile semiconductor device. In the method of manufacturing the SONOS-type non-volatile semiconductor device, a first oxide layer including silicon oxide is formed on a semiconductor substrate. A first silicon nitride ($Si_aN_b$) thin film is formed on the first oxide layer. A First composition ratio (a/b) of silicon with respect to nitrogen in the silicon nitride layer is in a range of about 0.7 to about 0.85. A second silicon nitride ($Si_cN_d$) thin film is formed on the first nitride thin film by a cyclic CVD process using a silicon source material and a nitrogen source gas. A second composition ratio (c/d) of silicon with respect to nitrogen in the silicon nitride layer is in a range of about 0.85 to about 1.5. A second oxide layer is formed on the second silicon nitride thin film. A conductive layer is formed on the second oxide layer. A gate structure including a charge-trapping dielectric and a conductive pattern is formed on the charge-trapping dielectric by sequentially etching the conductive layer, the second oxide layer, the silicon nitride layer and the first oxide layer. The charge-trapping dielectric has a multilayer structure in which a first oxide layer pattern, a silicon nitride layer pattern and a second oxide layer pattern are sequentially formed on the semiconductor substrate. Source/drain regions are formed at surface portions of the semiconductor substrate adjacent to the gate structure by doping impurities onto the substrate adjacent to the gate structure.

According to the embodiments, the charge-trapping dielectric including silicon-rich nitride employed for forming the SONOS-type non-volatile semiconductor device may not only have a good charge storing capacity but may also allow electrons stored in the charge-trapping dielectric to be easily erased. Thus, the SONOS-type non-volatile semiconductor device in accordance with example embodiments may have greatly increased input and erase speeds.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF EXAMPLE EMBODIMENTS

Figure 1:
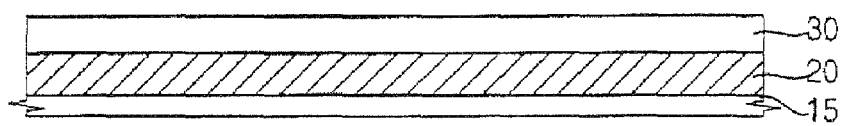
FIG. 1 is a cross-sectional view illustrating a charge-trapping dielectric in accordance with an embodiment.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Charge-Trapping Dielectric

FIG. 1 is a cross-sectional view illustrating a charge-trapping dielectric in accordance with an example embodiment.

Referring to FIG. 1, a charge-trapping dielectric 50, which may be employed for forming a silicon-oxide-nitride-oxide-silicon (SONOS)-type non-volatile semiconductor device, has a multilayer structure in which a first oxide layer 15, a silicon nitride layer 20, and a second oxide layer 30 are sequentially formed.

Particularly, the first oxide layer 15 may serve as a tunneling layer providing an energy barrier in electron tunneling.

The first oxide layer 15 may include silicon oxide. The first oxide layer 15 may have a thickness of about 20 Å to about 50 Å, preferably having a thickness of about 20 Å to about 40 Å, more preferably having a thickness of about 25 Å to about 35 Å, and most preferably having a thickness of about 30 Å. The first oxide layer 15 may be relatively thin because the SONOS-type non-volatile semiconductor device performs programming by storing electrons in a trap formed in the charge-trapping dielectric 50.

The silicon nitride layer 20 may serve as a storing layer for electrons.

The silicon nitride layer 20, with a composition denoted by $Si_xN_y$, may include silicon-rich nitride. $Si_xN_y$ refers to x-number of Silicon atoms and y-number of Nitrogen atoms. The silicon nitride layer 20 including silicon-rich nitride may be formed by a cyclic chemical vapor deposition (CVD) process using a silicon source material and a nitrogen source gas.

Particularly, a composition ratio (x/y) of silicon with respect to nitrogen in the silicon nitride layer 20 may be in a range of about 0.7 to about 1.5, preferably in a range of about 0.85 to about 1.3, and more preferably in a range of about 0.9 to about 1.2. Additionally, when y is about 4.0, x is preferably in a range of about 3.0 to 6.0 and more preferably in a range of about 3.5 to about 5.5.

The silicon nitride layer 20 may have a thickness of about 50 Å to about 100 Å, preferably having a thickness of about 60 Å to about 90 Å, more preferably having a thickness of about 65 Å to about 80 Å, and most preferably having a thickness of about 70 Å.

The second oxide layer 30 may serve as a voltage barrier isolating a voltage applied from an electrode (not shown) of the SONOS-type non-volatile semiconductor device. The second oxide layer 30 may include silicon oxide or a metal oxide.

Method of Manufacturing a Charge-Trapping Dielectric

Figure 2:
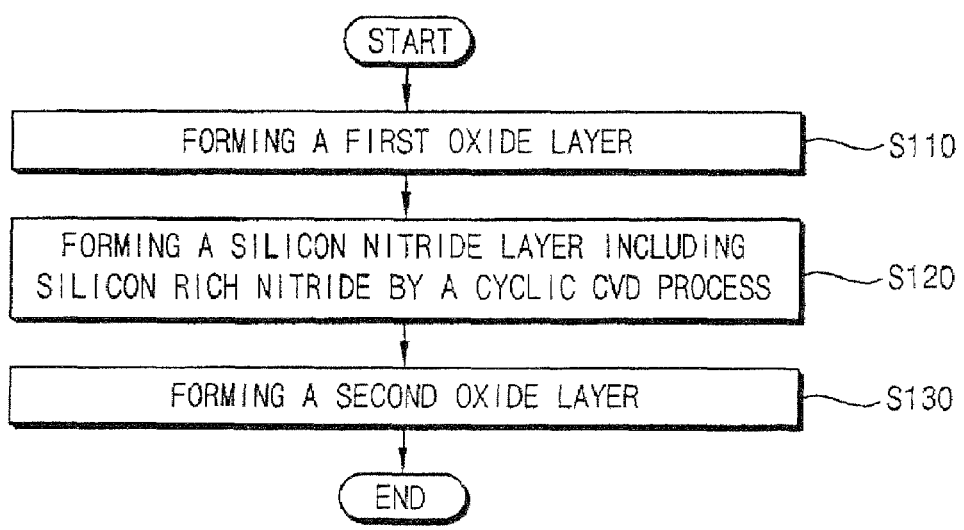
FIG. 2 is a process flow chart illustrating a method of manufacturing the charge-trapping dielectric in FIG. 1.

FIG. 2 is a process flow chart illustrating a method of manufacturing the charge-trapping dielectric in FIG. 1.

Referring to FIGS. 1 and 2, in step S110, the first oxide layer 15 is formed on a semiconductor substrate (not shown).

Particularly, the first oxide layer 15 may be formed by a CVD process, a sub-atmospheric CVD process, a low-pressure CVD process, a plasma-enhanced CVD process, or a thermal oxidation process. In an example embodiment, the first oxide layer 15 is formed by the thermal oxidation process.

The thermal oxidation process for forming the first oxide layer 15 may be performed at a temperature of about 900° C. to about 1,200° C. Particularly, the temperature in the thermal oxidation process slowly increases to the above-mentioned temperature of about 900° C. to about 1,200° C. so that the semiconductor substrate may not experience a rapid temperature variation. Additionally, after forming the first oxide layer 15 by performing the thermal oxidation process while maintaining a temperature, which may be in a range below about ±1° C. from the above-mentioned temperatures, the temperature slowly decreases. In the thermal oxidation process, oxygen ($O_2$), gas, or water ($H_2O$) vapor may be provided onto the semiconductor substrate so that the oxygen gas or the water vapor may serve as a reactive material for the thermal oxidation.

In an example embodiment, the first oxide layer 15 may be formed to have a thickness of about 20 Å to about 50 Å, preferably about 25 Å to about 40 Å, more preferably about 25 Å to about 35 Å, and most preferably about 30 Å. The first oxide layer 15 may be relatively thin because the SONOS-type non-volatile semiconductor device performs programming by storing electrons in a trap formed in the charge-trapping dielectric 50.

In step S120, a silicon nitride ($Si_xN_y$) layer 20 including silicon-rich nitride may be formed on the first oxide layer 15.

Particularly, the silicon nitride layer 20 may be formed by a cyclic CVD process using a silicon source gas and a nitrogen source gas. A composition ratio (x/y) of silicon with respect to nitrogen in the silicon nitride layer may be in a range of about 0.7 to about 1.5.

Generally, the silicon nitride layer 20 including silicon-rich nitride may be formed by a CVD process using dichlorosilane ($SiH_2Cl_2$) gas and ammonia ($NH_3$) gas. However, an amount of the dichlorosilane ($SiH_2Cl_2$) gas that may be used is required to be increased to form the silicon nitride layer 20 by the CVD process. The increase of the amount of the dichlorosilane ($SiH_2Cl_2$) gas that may be used leads to an increase in generation of ammonium chloride ($NH_4Cl$) salt, which is a reaction byproduct. The ammonium chloride ($NH_4Cl$) salt may serve as particles on the semiconductor substrate. Thus, in the present example embodiment, the silicon nitride layer 20 including silicon-rich nitride may be formed by the cyclic CVD process.

Hereinafter, a method of forming the silicon nitride layer by the cyclic CVD process will be described in detail.

A silicon source material may be provided onto the first oxide layer formed on the semiconductor substrate that is loaded in a chamber where the cyclic CVD process may be performed for about 0.5 s to about 5.0 s. In an example embodiment, the silicon source material may be provided for about 1.0 s. A liquid delivery system (LDS) may be used for supplying the silicon source material.

Examples of the silicon source material for forming the silicon nitride layer including silicon-rich nitride are hexachlorodisilane ($Si_2Cl_6$) and octachlorotrisilane ($Si_3Cl_8$). In an example embodiment, hexachlorodisilane ($Si_2Cl_6$) in a gaseous state, which may be a vaporized form of hexachlorodisilane ($Si_2Cl_6$) in a liquid state, may be used as the silicon source material.

Hence, some parts of the silicon source material are chemically absorbed (referred to as "chemisorbed") on a surface of the first oxide layer, and the other parts of the silicon source material are physically adsorbed (referred to as "physisorbed") on a surface of the first oxide layer or drift in the chamber.

A first purge gas may be provided into the chamber. For example, the first purge gas may be a nitrogen source gas, an inert gas such as argon gas, etc. The first purge gas may be provided for about 1.0 s to about 30 s. Thus, the parts of the silicon source material drifting in the chamber or having been physisorbed on the surface of the first oxide layer are removed from the chamber, and the parts of the silicon source material having been chemisorbed on the surface of the first oxide layer are not removed.

The nitrogen source gas may be provided into the chamber. Examples of the nitrogen source gas are ammonia ($NH_3$) gas and amine ($RNH_2$) gas. Here, R may be an alkyl group. These can be used alone or in a mixture thereof. The nitrogen source gas may be provided for about 0.5 s to about 5.0 s. Being provided into the chamber, the nitrogen source gas may be reacted with the silicon source material chemisorbed on the surface of the first oxide layer to form silicon-rich nitride.

A second purge gas may be provided into the chamber. A kind of the second purge gas and a supply time of the second gas may be substantially the same as those of the first purge gas. Being provided into the chamber, the second purge gas removes some parts of the nitrogen source gas not chemically being reacted with the silicon source material. Hence, a preliminary silicon nitride ($Si_xN_y$) layer (not shown) including silicon-rich nitride, which has a given thickness, may be formed on the first oxide layer 15.

A composition ratio (x/y) of silicon with respect to nitrogen in the preliminary silicon nitride layer may be in a range of about 0.7 to about 1.5, and preferably in a range of about 0.9 to about 1.2. Additionally, when y is about 4.0, x is preferably in a range of about 3.0 to about 6.0, and more preferably in a range of about 3.5 to about 5.5.

A formation of the preliminary silicon nitride layer may be repeated at least five times to ten times. Hence, the silicon nitride layer 20 including a plurality of the preliminary silicon nitride layers may be formed on the first oxide layer 15. The silicon nitride layer 20 includes silicon-rich nitride ($Si_xN_y$) in which a composition ratio (x/y) of silicon with respect to nitrogen may be in the range of about 0.7 to about 1.5. Additionally, a thickness of the silicon nitride layer 20 may be controlled according to a repetition number of the formation of the preliminary silicon nitride layer.

The cyclic CVD process for forming the silicon nitride layer 20 may be preferably performed at a temperature of about 400° C. to about 700° C., and more preferably performed at a temperature of about 450° C. to about 650° C. Alternatively, in the formation of the preliminary silicon nitride layer, a silicon-rich nitride having higher silicon content may be formed by supplying additional silane ($SiCl_4$) gas.

In an example embodiment, the silicon nitride layer 20 may be formed to have a thickness of about 50 Å to about 100 Å, preferably about 60 Å to about 90 Å, more preferably about 65 Å to about 80 Å, and most preferably about 70 Å.

In step S130, the second oxide layer 30 may be formed on the silicon nitride layer 20 including silicon-rich nitride.

Particularly, the second oxide layer 30 may be formed using a metal oxide or silicon oxide. When the second oxide layer 30 is formed using a metal oxide, the second oxide layer 30 may be formed by a CVD process. When the second oxide layer 30 is formed using silicon oxide, the second oxide layer 30 may be formed by a radical oxidation process.

In an example embodiment, the second oxide layer 30 may be formed to have a thickness of about 100 Å to about 200 Å, preferably about 120 Å to about 180 Å, more preferably about 130 Å to about 170 Å, and most preferably about 150 Å.

SONOS-Type Non-Volatile Semiconductor Device

Figure 3:
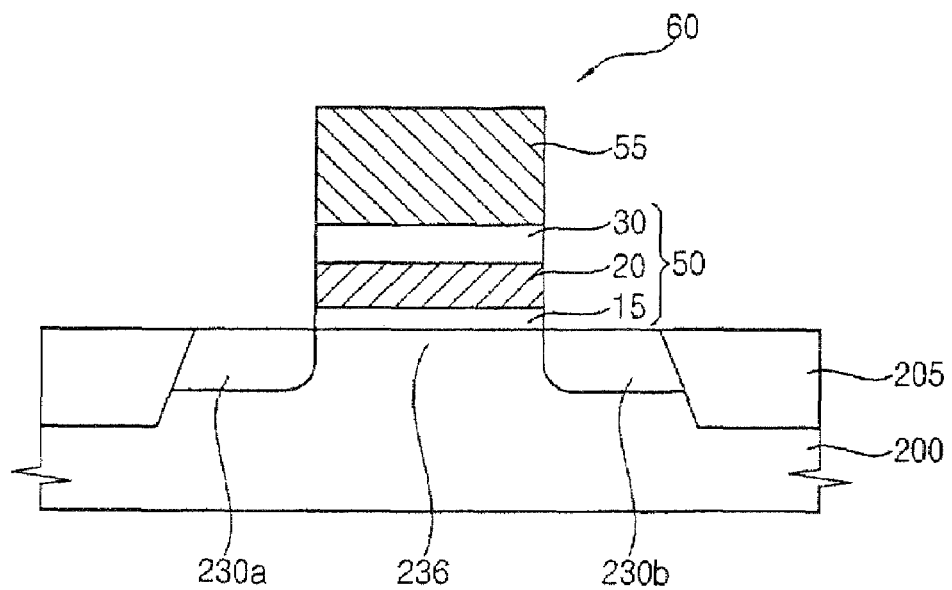
FIG. 3 is a cross-sectional view illustrating a silicon-oxide-nitride-oxide-silicon (SONOS)-type non-volatile semiconductor device in accordance with the embodiment of FIG. 1.

FIG. 3 is a cross-sectional view illustrating a SONOS-type non-volatile semiconductor device in accordance with another embodiment.

Referring to FIG. 3, the SONOS-type non-volatile semiconductor device includes a gate structure 60 having a charge-trapping dielectric 50 and an electrode 55 formed on a semiconductor substrate 200. For example, the semiconductor substrate 200 may include a silicon substrate, a silicon-on-insulator (SOI) substrate, a germanium substrate, a germanium-on-insulator (GOI) substrate, a silicon-germanium substrate, and an epitaxial thin-film substrate formed by a selective epitaxial growth (SEG) process.

An isolation layer 205 may be formed at an upper portion of the semiconductor substrate 200 to define an active area and a field area in the semiconductor substrate 200. The isolation layer 205 may include a field oxide layer or a trench isolation layer.

Source/drain regions 230a and 230b doped with impurities are formed at surface portions of the semiconductor substrate 200. Particularly, the source/drain regions 230a and 230b are formed at surface portions of the semiconductor substrate 200 adjacent to the gate structure 60 formed on the semiconductor substrate 200.

The impurities for forming the source/drain regions may include materials in Group V of the Periodic Table, such as phosphorous, arsenic, etc. as n-type impurities. These may be used alone or a mixture thereof. In an example embodiment, the impurities are doped onto the semiconductor substrate 200 by an ion implantation process.

A channel region 236 may be formed between the source/drain regions 230a and 230b at a surface portion of the semiconductor substrate 200 on which the gate structure 60 may be formed.

The gate structure 60 includes the charge-trapping dielectric 50 and the electrode 55 formed on the charge-trapping dielectric 50. The charge-trapping dielectric 50 has a first oxide layer pattern 15, a silicon nitride layer pattern 20, and a second oxide layer pattern 30 sequentially formed on the semiconductor substrate 200, as described in the previous embodiment. The silicon nitride ($Si_xN_y$) layer pattern 20 includes silicon-rich nitride, and a composition ratio (x/y) of silicon with respect to nitrogen in the silicon nitride layer 20 may be in a range of about 0.7 to about 1.5, and preferably in a range of about 0.85 to about 1.3.

Hereinafter, programming and erasing of data using the SONOS-type non-volatile semiconductor device including the gate structure 60 in a unit cell will be described in detail by an example.

In this example, when the data is programmed using the SONOS-type non-volatile semiconductor device, the semiconductor substrate 200 may be grounded and a positive voltage may be applied to the electrode 55. Then, an electric field is formed between the semiconductor substrate 200 and the electrode 55 of the gate structure 60 to generate a Fowler-Nordheim current across the first oxide layer pattern 15 of the charge-trapping dielectric 50. Accordingly, electrons moving in the channel region 236 positioned between the source/drain regions 230a and 230b tunnel through an energy barrier of the first oxide layer pattern 15 to move into the silicon nitride pattern 20 including silicon-rich nitride. The electrons stored in the silicon nitride layer pattern 20 are blocked from moving into the electrode 55 by an energy barrier of the second oxide layer pattern 30 of the charge-trapping dielectric 50. Hence, the electrons are trapped in the silicon nitride layer pattern 20 so that the data may be programmed in the SONOS-type non-volatile semiconductor device.

When the data is erased in the SONOS-type non-volatile semiconductor device, the semiconductor substrate 200 may be grounded and a negative voltage may be applied to the electrode 55. Then, an electric field is formed between the semiconductor substrate 200 and the electrode 55 of the gate structure 60 in an opposite direction to that when the data is programmed, to generate a Fowler-Nordheim current across the first oxide layer pattern 15 of the charge-trapping dielectric 50 in an opposite direction to that when the data is programmed. Accordingly, the electrons stored in the charge-trapping dielectric 50 tunnel through the energy barrier of the first oxide layer pattern 15 to move into the semiconductor substrate 200. Hence, the data may be erased in the SONOS-type non-volatile semiconductor device.

Method of Manufacturing a SONOS-Type Non-Volatile Semiconductor Device

FIGS. 4A to 4E are cross-sectional views illustrating a method of manufacturing the SONOS-type non-volatile semiconductor device in FIG. 3, according to an embodiment.

Figure 4A:
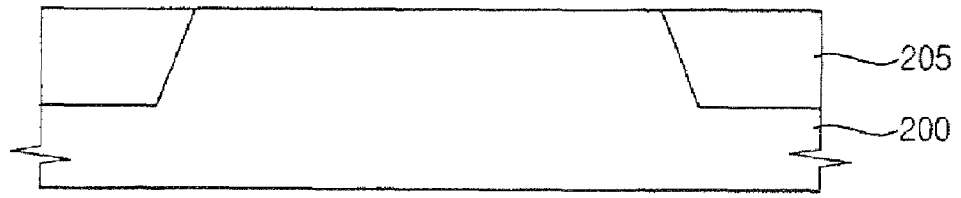
FIGS. 4A to 4E are cross-sectional views illustrating a method of manufacturing the SONOS-type non-volatile semiconductor device in FIG. 3.

Referring to FIG. 4A, an isolation layer 205 may be formed at an upper portion of the semiconductor substrate 200 to define an active area and a field area in the semiconductor substrate 200. In an example embodiment, a trench isolation layer may be formed as the isolation layer 205 in consideration of an integration degree.

Figure 4B:
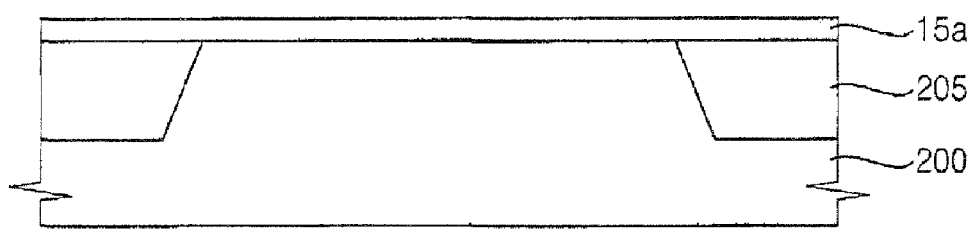

Referring to FIG. 4B, a first oxide layer 15a including silicon oxide may be formed on the semiconductor substrate 200 having the isolation layer 205. The first oxide layer 15a corresponds to the first oxide layer pattern 15 of the charge-trapping dielectric 50 shown in FIG. 3. In an example embodiment, the first oxide layer 15a may be formed by a thermal oxidation process.

In an example embodiment, the first oxide layer 15a may be formed to have a thickness of about 20 Å to about 50 Å, preferably about 20 Å to about 40 Å, more preferably about 25 Å to about 35 Å, and most preferably about 30 Å. The first oxide layer 15 may be relatively thin because the SONOS-type non-volatile semiconductor device performs programming by storing electrons in a trap formed in a charge-trapping dielectric.

Figure 4C:
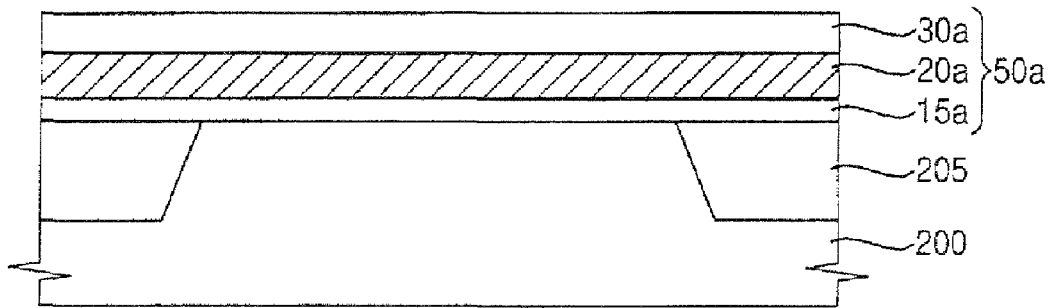

Referring to FIG. 4C, a silicon nitride ($Si_xN_y$) layer 20a including silicon-rich nitride may be formed on the first oxide layer 15a including silicon oxide. The silicon nitride layer 20a corresponds to the silicon nitride layer pattern 20 of the charge-trapping dielectric 50 shown in FIG. 3. In an example embodiment, the silicon nitride layer 20a may be formed by a cyclic CVD process using a silicon source material and a nitrogen source gas.

Particularly, the cyclic CVD process may be performed at a temperature of about 400° C. to about 700° C. using hexachlorodisilane ($Si_2Cl_6$) and octachlorotrisilane ($Si_3Cl_8$) as the silicon source material, and using ammonia ($NH_3$) gas and amine ($4NH_2$) gas as the nitrogen source gas.

A composition ratio (x/y) of silicon with respect to nitrogen in the silicon nitride layer 20a may be in a range of about 0.7 to about 1.5, preferably in a range of about 0.85 to about 1.3, and more preferably in a range of about 0.9 to about 1.2. Additionally, when y is about 4.0, x is preferably in a range of about 3.0 to 6.0, and more preferably in a range of about 3.5 to about 5.5.

A second oxide layer 30a including a metal oxide may be formed on the silicon nitride layer 20a. The second oxide layer 30a corresponds to the second oxide layer pattern 30 of the charge-trapping dielectric 50 shown in FIG. 3. In an example embodiment, the second oxide layer 30a including a metal oxide may be formed by a CVD process.

Figure 4D:
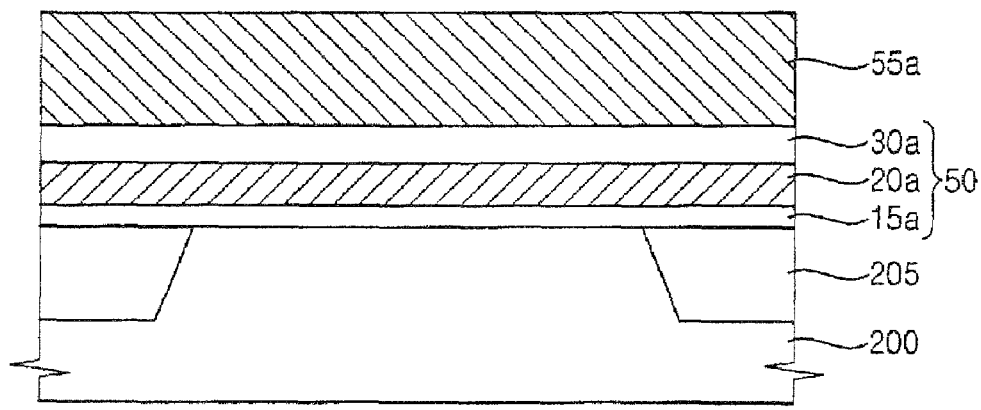

Referring to FIG. 4D, a conductive layer 55a doped with impurities capable of generating holes as charge carriers may be formed on the second oxide layer 30a. The conductive layer 55a corresponds to the electrode 55 of the gate structure 60 shown in FIG. 3.

Figure 4E:
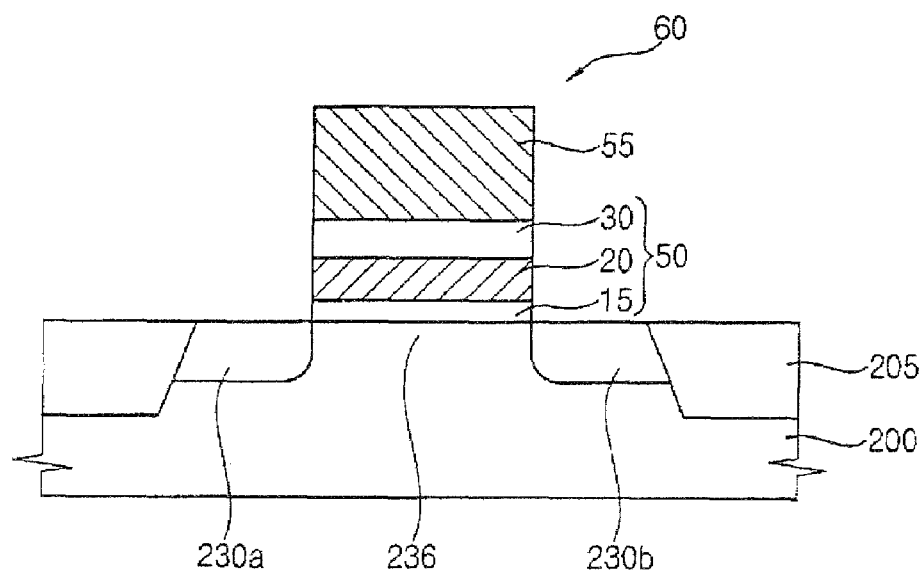

Referring to FIG. 4E, the conductive layer 55a, the second oxide layer 30a, the silicon nitride layer 20a including silicon-rich nitride, and the first oxide layer 10a are sequentially patterned using an etching mask, to thereby form a gate structure 60 including a charge-trapping dielectric 50 and an electrode 55 formed on the semiconductor substrate 200. The charge-trapping dielectric 50 includes the first oxide layer pattern 15, the silicon nitride layer pattern 20, and the second oxide layer pattern 30 sequentially formed on the semiconductor substrate 200. The gate structure 60 may be formed into another type, such as a vertical type, a pin type, etc., instead of a planar type as illustrated above.

Impurities are implanted onto surface portions of the semiconductor substrate 200 using the gate structure 60 as a mask to form source/drain regions 230a and 230b at surface portions of the semiconductor substrate 200 adjacent to the gate structure 60 formed on the semiconductor substrate 200. Accordingly, as the source/drain regions 230a and 230b are formed, a channel region 236 may be formed between the source/drain regions 230a and 230b at a surface portion of the semiconductor substrate 200.

Hence, the SONOS-type non-volatile semiconductor device having the gate structure 60 that includes the charge-trapping dielectric 50 and the electrode 55 in a unit cell is completed.

Charge-Trapping Dielectric

Figure 5:
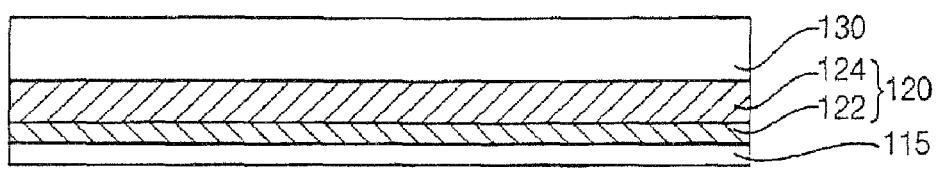
FIG. 5 is a cross-sectional view illustrating a charge-trapping dielectric in accordance with another embodiment.

FIG. 5 is a cross-sectional view illustrating a charge-trapping dielectric in accordance with another example embodiment.

Referring to FIG. 5, the charge-trapping dielectric 50, as described earlier, may be employed for forming a SONOS-type non-volatile semiconductor device, and has a multilayer structure in which a first oxide layer 115, a silicon nitride layer 120, and a second oxide layer 130 may be sequentially formed. The silicon nitride layer 120 has a first silicon nitride thin film 122 and a second silicon nitride thin film 124 including silicon-rich nitride formed on the first silicon nitride thin film 122.

Particularly, the first oxide layer 115 may serve as a tunnel layer providing an energy barrier for electron tunneling.

The first oxide layer 115 may include silicon oxide. The first oxide layer 115 may have a thickness of about 20 Å to about 50 Å. The thickness of the first oxide layer 115 may be changed according to a level of programming or erasing efficiency of the SONOS-type non-volatile semiconductor device.

The silicon nitride layer 120 may serve as a storing layer for the electrons.

In one example embodiment, the silicon nitride layer 120 has a structure in which the first silicon nitride thin film 122, $Si_aN_b$, where a/b denotes a first composition ratio, and the second silicon nitride thin film 124, $Si_cN_d$, where c/d denotes a second composition ratio, including silicon-rich nitride are sequentially stacked. The first silicon nitride thin film 122 includes silicon nitride, and the second silicon nitride thin film 124 includes silicon-rich nitride with a silicon content that is relatively high.

Particularly, the first composition ratio (a/b) of silicon with respect to nitrogen in the first silicon nitride thin film 122 is preferably in a range of about 0.7 to about 0.85, more preferably about 0.7 to about 0.8, and most preferably about 0.75. On the other hand, the second composition ratio (c/d) of silicon with respect to nitrogen in the second silicon nitride thin film 122 is preferably in a range of about 0.85 to about 1.5, more preferably about 0.9 to about 1.3, and most preferably about 1.0. Additionally, when d is about 4.0, c is preferably in a range of about 3.0 to 6.0, and more preferably in a range of about 3.5 to about 5.5. The first silicon nitride thin film 122 employed for forming the SONOS-type non-volatile semiconductor device improves retention of electrons trapped in the silicon-rich nitride thin film 124 while programming.

In another example embodiment, the silicon nitride layer 120 may have a sequentially stacked structure of a first silicon nitride thin film including substantially the same material and composition as those of the first silicon nitride thin film 122, a second silicon nitride thin film, and a third silicon nitride thin film.

The second oxide layer 130 may serve as a voltage barrier isolating a voltage applied from an electrode (not shown) of the SONOS-type non-volatile semiconductor device. The second oxide layer 130 may include silicon oxide or a metal oxide.

Method of Manufacturing a Charge-Trapping Dielectric

Figure 6:
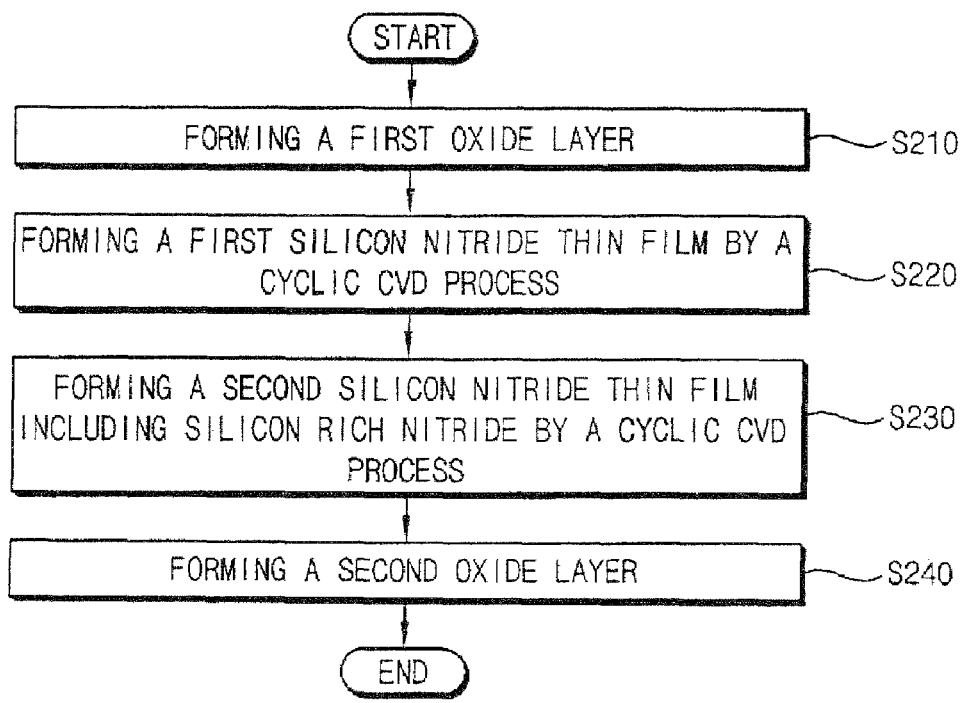
FIG. 6 is a process flow chart illustrating a method of manufacturing the charge-trapping dielectric in FIG. 5.

FIG. 6 is a process flow chart illustrating a method of manufacturing the charge-trapping dielectric of the embodiment shown in FIG. 5.

Referring to FIGS. 5 and 6, in step S210, the first oxide layer 115 is formed on a semiconductor substrate (not shown). A method of forming the first oxide layer 115 may be substantially the same as that of the first oxide layer 15 shown in FIGS. 1 and 2.

In step S220, a first silicon nitride ($Si_aN_b$) thin film 122 including silicon nitride may be formed on the first oxide layer 115. Particularly, the first silicon nitride thin film 122 may be formed by a cyclic CVD process using a silicon source gas and a nitrogen source gas. A first composition ratio (a/b) of silicon with respect to nitrogen in the silicon nitride thin film 122 is preferably in a range of about 0.7 to about 0.85, more preferably about 0.7 to about 0.8, and most preferably about 0.75. The first silicon nitride thin film 122 employed for forming the SONOS-type non-volatile semiconductor device improves retention of electrons trapped in a silicon-rich nitride thin film 124 while programming. The forming and the features of the first silicon nitride thin film 122 are the same as the first silicon nitride thin film as shown in FIG. 5. Thus, any further explanation in this regard will be omitted.

In step S230, in one example embodiment, a second silicon nitride ($Si_cN_d$) thin film 124 also including silicon-rich nitride may be formed on the first silicon nitride thin film 122 by a cyclic CVD process using the silicon source gas and the nitrogen source gas. A second composition ratio (c/d) of silicon with respect to nitrogen in the second silicon nitride thin film 124 may be in a range of about 0.85 to about 1.5. A method of forming the second silicon nitride thin film 124 may be substantially the same as that of the silicon nitride layer 20 shown in FIGS. 1 and 2. Additionally, when forming the second silicon nitride thin film 124 by the cyclic CVD process, silane ($SiCl_4$) gas may be provided into the chamber.

Hence, a silicon nitride layer 120 for trapping electrons having the first silicon nitride thin film 122 and the second silicon nitride thin film 124 including silicon-rich nitride formed on the first silicon nitride thin film 122 may be formed on the first oxide layer 115.

A first thickness of the first silicon nitride thin film is about 5% to about 60% of a total thickness of the first and second silicon nitride thin films 122 and 124, preferably about 25 to about 45% of the total thickness, and more preferably about 30 to about 40% of the total thickness, On the other hand, a second thickness of the second silicon nitride thin film is about 40% to about 95% of the total thickness of the first and second silicon nitride thin films 122 and 124, preferably about 60 to about 75% of the total thickness, and a more preferably about 65 to about 70% of the total thickness.

The first and second silicon nitride thin films 124 may be formed by an in-situ process.

In another example embodiment, a third silicon nitride thin film may be further formed on the second silicon nitride thin film 124. Here, the third silicon nitride thin film may be formed using substantially the same method as that of the first silicon nitride thin film 122.

A second oxide layer 130 may be formed on the silicon nitride layer 120, and may be formed using a metal oxide. The second oxide layer 130 may be formed using substantially the same method as that of the second oxide layer 30 in FIG. 1.

SONOS-Type Non-Volatile Semiconductor Device

Figure 7:
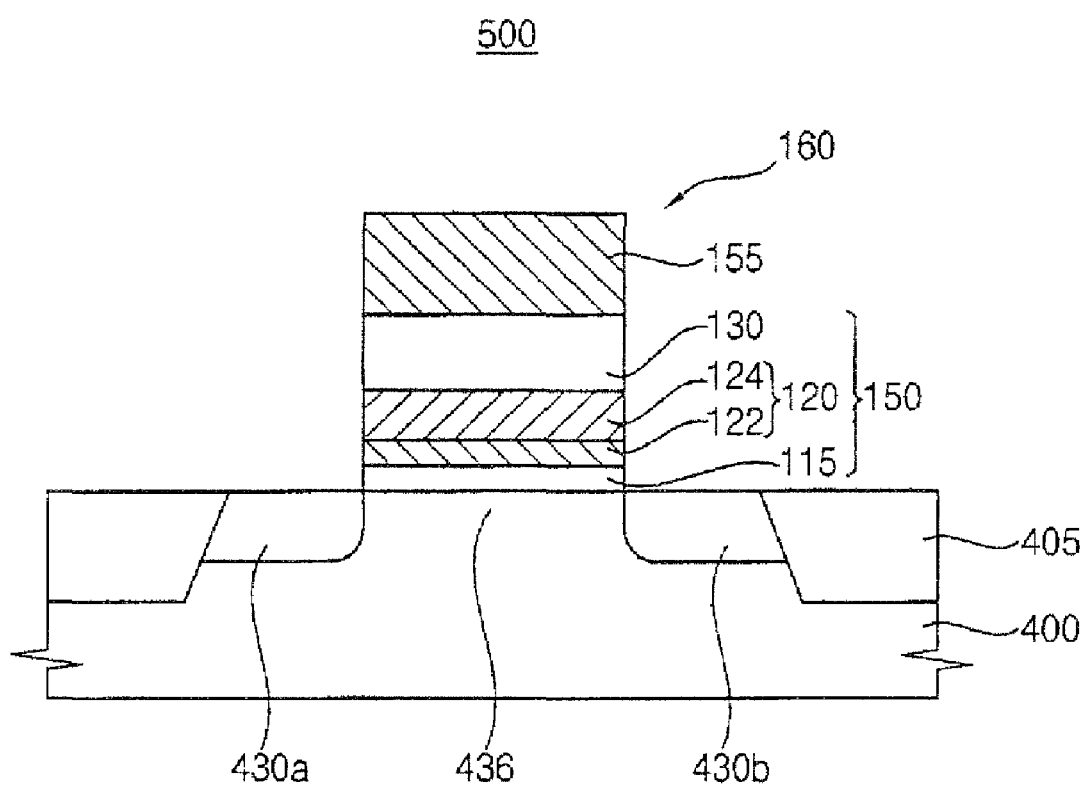
FIG. 7 is a cross-sectional view illustrating a SONOS-type non-volatile semiconductor device in accordance with the embodiment of FIG. 5.

FIG. 7 is a cross-sectional view illustrating a SONOS-type non-volatile semiconductor device in accordance with another example embodiment.

Referring to FIG. 7, the SONOS-type non-volatile semiconductor device includes a gate structure 160 having a charge-trapping dielectric 150 and an electrode 155 formed on a semiconductor substrate 400. The charge-trapping dielectric 150 includes a first oxide layer pattern 115, a first silicon nitride thin-film pattern 122, a second silicon nitride thin-film pattern 124 including silicon-rich nitride, and a second oxide layer pattern 130.

The first silicon nitride ($Si_aN_b$) thin-film pattern 122 includes silicon nitride, and a first composition ratio (a/b) of silicon with respect to nitrogen in the first silicon nitride thin-film pattern 122 is in a range of about 0.7 to about 0.85, and preferably in a range of about 0.7 to about 0.8. A first thickness of the first silicon nitride thin-film pattern 122 is about 5% to about 60% of a total thickness of the first and second silicon nitride thin-film patterns 122 and 124, preferably about 25 to about 45% of the total thickness, and more preferably about 30 to about 40% of the total thickness.

On the other hand, a second silicon nitride ($Si_cN_d$) thin-film pattern 124 includes silicon nitride, and a second composition ratio (c/d) of silicon with respect to nitrogen in the second silicon nitride thin-film pattern 124 is in a range of about 0.85 to about 1.5, and preferably in a range of about 0.9 to about 1.3. A second thickness of the second silicon nitride thin-film pattern 124 is about 40% to about 95% of a total thickness of the first and second silicon nitride thin-film patterns 122 and 124, preferably about 60 to about 75%, and more preferably about 65 to about 70%.

Alternatively, the charge-trapping dielectric 150 may further include a third silicon nitride thin-film pattern (not shown) formed on the second silicon nitride thin-film pattern 124.

Source/drain regions 430a and 430b doped with impurities are formed at surface portions of the semiconductor substrate 400. Particularly, the source/drain regions 430a and 430b are formed at surface portions of the semiconductor substrate 400 adjacent to the gate structure 160 formed on the semiconductor substrate 400.

A channel region 436 may be formed between the source/drain regions 430a and 430b at a surface portion of the semiconductor substrate 400 on which the gate structure 160 is formed.

The isolation layer 405 and source/drain regions 430a and 430b may be substantially the same as those of the SONOS-type non-volatile semiconductor device shown in the embodiment of FIG. 3.

Method of Manufacturing a SONOS-Type Non-Volatile Semiconductor Device

FIGS. 8A to 8D are cross-sectional views illustrating a method of manufacturing the SONOS-type non-volatile semiconductor device in FIG. 7.

Figure 8A:
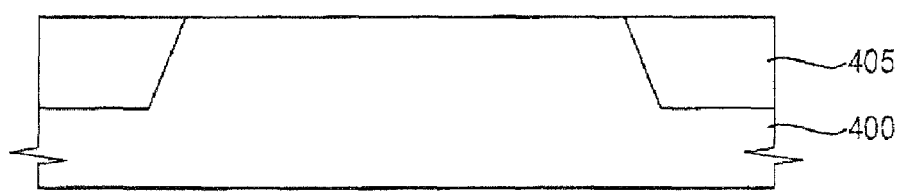
FIGS. 8A to 8D are cross-sectional views illustrating a method of manufacturing the SONOS-type non-volatile semiconductor device in FIG. 7.

Referring to FIG. 8A, an isolation layer 405 may be formed at an upper portion of the semiconductor substrate 400 to define an active area and a field area in the semiconductor substrate 400.

Figure 8B:
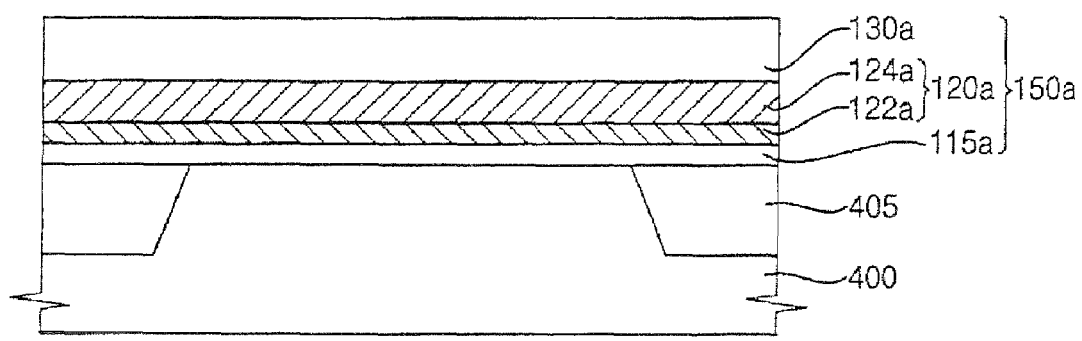

Referring to FIG. 8B, a first oxide layer 115a including silicon oxide may be formed on the semiconductor substrate 400 having the isolation layer 405. The first oxide layer 115a corresponds to the first oxide layer pattern 115 of the charge-trapping dielectric 150 shown in FIG. 7.

A first silicon nitride ($Si_aN_b$) thin film 122a including silicon nitride may be formed on the first oxide layer 115a including silicon oxide. A first composition ratio (a/b) of silicon with respect to nitrogen may be in a range of about 0.7 to about 0.85. A method of forming the first silicon nitride thin film 122a may be substantially the same as that of the first silicon nitride thin film 122 shown in FIGS. 5 and 6.

A second silicon nitride ($Si_cN_d$) thin film 124a including silicon-rich nitride may be formed on the first silicon nitride thin film 122a by a cyclic CVD process. A second composition ratio (c/d) of silicon with respect to nitrogen may be in a range of about 0.85 to about 1.85. A method of forming the second silicon nitride thin film 124a may be substantially the same as that of the second silicon nitride thin film 124 shown in FIGS. 5 and 6.

Hence, a silicon nitride layer 120a including the first silicon nitride thin film 122a and the second silicon nitride thin film 124a may be formed on the first oxide layer 115a.

A second oxide layer 130a including a metal oxide may be formed on the silicon nitride layer 120a. The second oxide layer 130a corresponds to the second oxide layer pattern 130 of the charge-trapping dielectric 150 shown in FIG. 7. The second oxide layer 130a including a metal oxide may be formed by a CVD process.

Figure 8C:
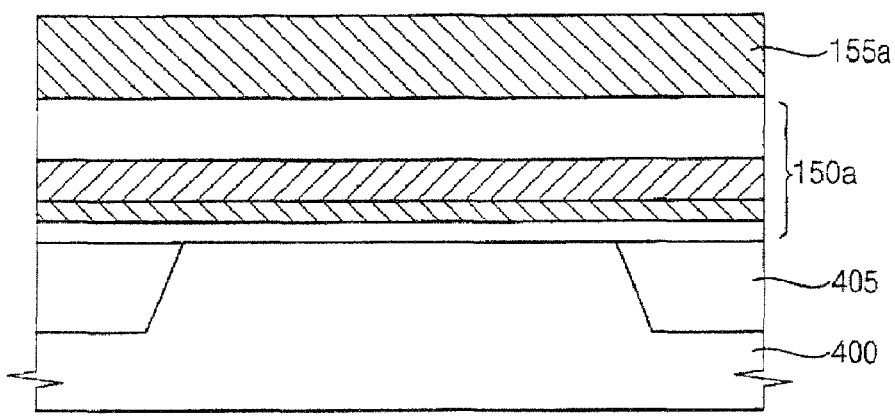

Referring to FIG. 8C, a conductive layer 155a may be formed on the second oxide layer 130a. The conductive layer 155a corresponds to the electrode 155 of the gate structure 160 shown in FIG. 7.

Figure 8D:
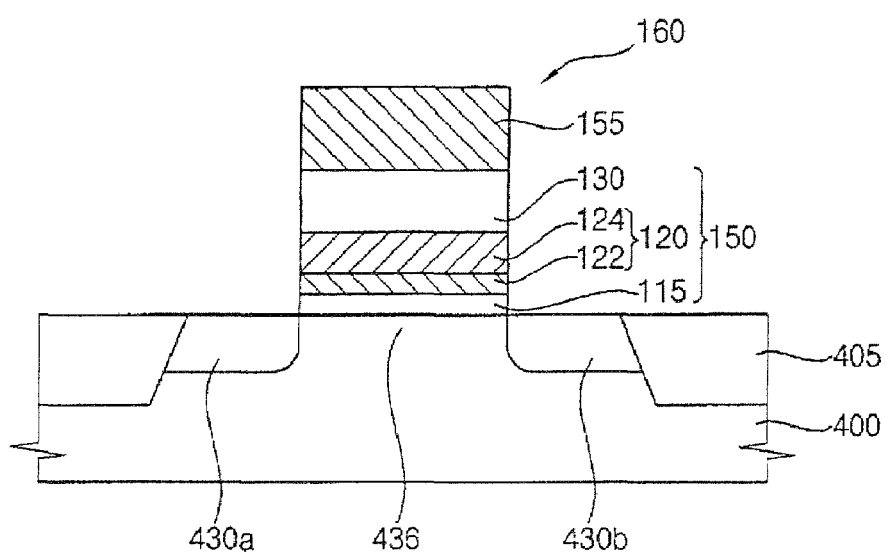

Referring to FIG. 8D, the conductive layer 155a, the second oxide layer 130a, the silicon nitride layer 120a including the first and second silicon nitride thin films 122a and 124a, and the first oxide layer 110a are sequentially patterned using an etching mask, to thereby form a gate structure 160 including a charge-trapping dielectric 150 and an electrode 155 formed on the semiconductor substrate 400. The charge-trapping dielectric 150 includes the first oxide layer pattern 115, the silicon nitride layer pattern 120, and the second oxide layer pattern 130 sequentially formed on the semiconductor substrate 400.

Impurities are implanted onto surface portions of the semiconductor substrate 400 using the gate structure 160 as a mask to form source/drain regions 430a and 430b at surface portions of the semiconductor substrate 400 adjacent to the gate structure 160 formed on the semiconductor substrate 400. Accordingly, as the source/drain regions 430a and 430b are formed, a channel region 436 may be Formed between the source/drain regions 430a and 430b at a surface portion of the semiconductor substrate 400.

Hence, the SONOS-type non-volatile semiconductor device having the gate structure 160 that includes the charge-trapping dielectric 150 and the electrode 155 in a unit cell is completed.

Evaluation of Data Erase Characteristics of a SONOS-Type Non-Volatile Semiconductor Device Data erase characteristics of a first SONOS-type non-volatile semiconductor device including a first charge-trapping dielectric having a silicon nitride layer formed by a conventional CVD process and those of a second SONOS-type non-volatile semiconductor device including a second charge-trapping dielectric having the silicon nitride thin film containing silicon-rich nitride shown in FIG. 5 were compared. The results of the evaluation are disclosed in FIG. 9.

Figure 9:
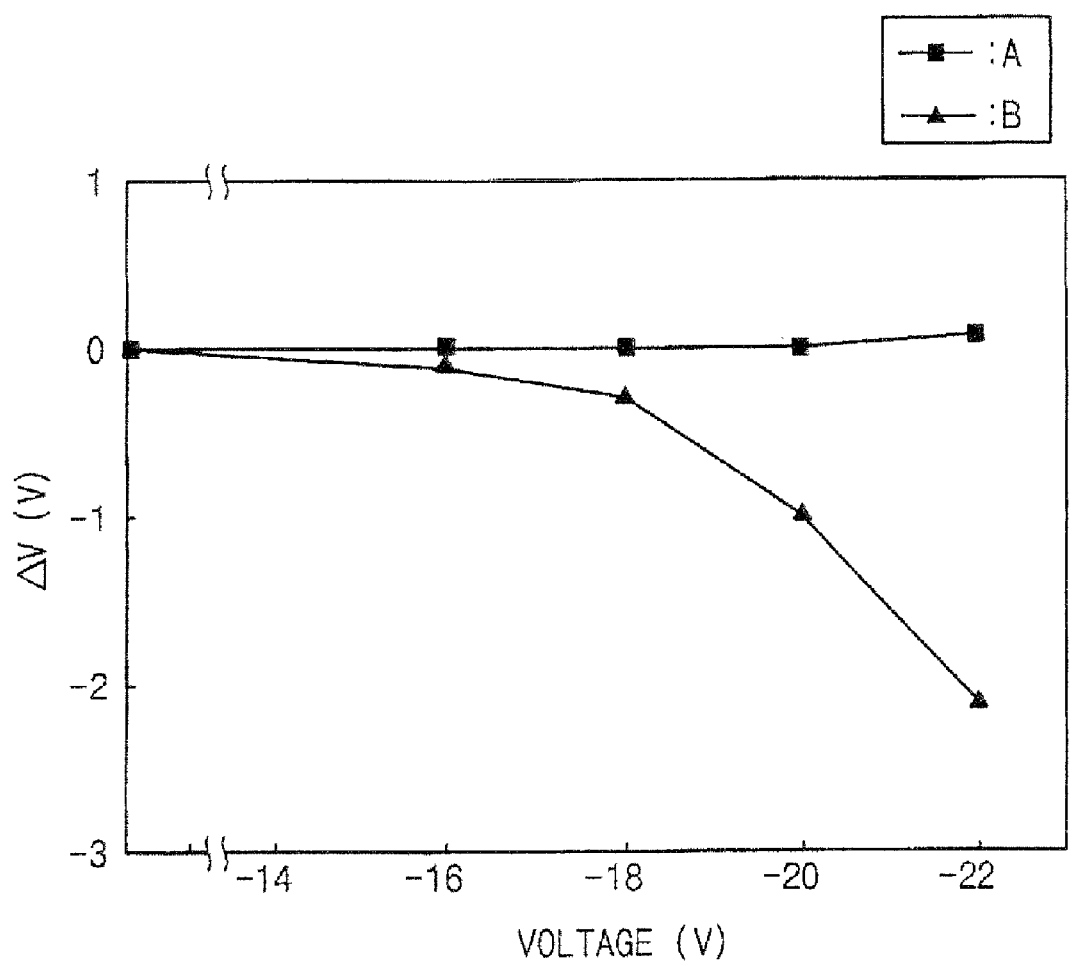
FIG. 9 is a graph showing voltage variations relative to voltages of the first and second SONOS-type non-volatile semiconductor devices.

FIG. 9 is a graph showing voltage variations relative to voltages of the first and second SONOS-type non-volatile semiconductor devices. Sample A represents the first SONOS-type non-volatile semiconductor device, and sample B represents the second SONOS-type non-volatile semiconductor device.

Sample A represents data erase characteristics of which a charge amount of stored electrons in a silicon nitride layer of the charge-trapping dielectric varies little as an applied voltage to the sample A increases. That is, as the applied voltage increases, the electrons stored in the silicon nitride layer are not erased but increase in amount.

On the other hand, sample B represents data erase characteristics of which a charge amount of stored electrons in a silicon nitride thin film including silicon-rich nitride of the charge-trapping dielectric greatly decreases as an applied voltage to the sample B increases. That is, as the applied voltage increases, the electrons stored in the silicon nitride layer are rapidly erased.

According to the present invention, when a SONOS-type non-volatile semiconductor device including a charge-trapping dielectric is used, electrons trapped in the charge-trapping dielectric may be sufficiently erased so that a data erase process may be properly and efficiently performed. Accordingly, the SONOS-type non-volatile semiconductor device may be more widely used.

The foregoing is illustrative and is not to be construed as limiting thereof. Although a few example embodiments have been described, those skilled in the art will readily appreciate that many modifications are possible in the example embodiments without materially departing from the novel teachings and advantages. Accordingly, all such modifications are intended to be included within the scope as defined in the claims. In the claims, means-plus-function clauses are intended to cover the structures described herein as performing the recited function and not only structural equivalents but also equivalent structures. Therefore, it is to be understood that the foregoing is illustrative and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of manufacturing a charge-trapping dielectric, the method comprising:
preparing a first oxide layer including silicon oxide;
forming a silicon nitride ($Si_xN_y$) layer on the first oxide layer by a cyclic chemical vapor deposition (CVD) process using a silicon source material and a nitrogen source gas, wherein a composition ratio (x/y) of silicon with respect to nitrogen in the silicon nitride layer is in a range of about 0.7 to about 1.5, in which forming the silicon nitride layer comprises
introducing the silicon source material in a gaseous state onto the first oxide layer;
chemisorbing the silicon source material onto a surface of the first oxide layer;
removing residual silicon source material that is not chemisorbed onto the surface of the first oxide layer;
introducing the nitrogen source gas onto the first oxide layer; and
forming a preliminary silicon nitride layer by a chemical reaction between the nitrogen source gas and the chemisorbed silicon source material; and
forming a second oxide layer on the silicon nitride layer.

2. The method of claim 1, wherein the silicon source material comprises one of hexachlorodisilane ($Si_2Cl_6$) and octachlorotrisilane ($Si_3Cl_8$).

3. The method of claim 1, wherein the nitrogen source gas comprises one of ammonia ($NH_3$) gas, amine ($RNH_2$) gas, and a mixture thereof, Here, R may be an alkyl group.

4. The method of claim 1, wherein the cyclic CVD process is performed at a temperature of about 400° C. to about 700° C.

5. The method of claim 1, wherein forming the silicon nitride layer is repeated at least five times.

6. The method of claim 1, wherein the second oxide layer comprises a metal oxide.

7. A method of manufacturing a charge-trapping dielectric, the method comprising:
preparing a first oxide layer including silicon oxide;
forming a first silicon nitride ($S_aN_b$) thin film on the first oxide layer, wherein a first composition ratio (a/b) of silicon with respect to nitrogen in the first silicon nitride thin film is in a range of about 0.7 to about 0.85;
forming a second silicon nitride ($S_cN_d$) thin film on the first silicon nitride thin film by a cyclic CVD process using a silicon source material and a nitrogen source gas, wherein a second composition ratio (c/d) of silicon with respect to nitrogen in the second silicon nitride thin film is in a range of about 0.85 to about 1.5, in which forming the second silicon nitride thin film comprises
introducing the silicon source material in a gaseous state onto the first silicon nitride thin film, chemisorbing the silicon source material onto a surface of the first silicon nitride thin film, removing residual silicon source material that is not chemisorbed onto the surface of the first silicon nitride thin film, introducing the nitrogen source gas onto the first silicon nitride thin film, and forming a preliminary silicon nitride layer by a chemical reaction between the nitrogen source gas and the chemisorbed silicon source material; and forming a second oxide layer on the second silicon nitride thin film.

8. The method of claim 7, wherein a thickness of the first silicon nitride thin film is about 5% to about 60% of a total thickness of the first and second silicon nitride thin films.

9. The method of claim 7, wherein a thickness of the second silicon nitride thin film is about 40% to about 95% of the total thickness of the first and second silicon nitride thin films.

10. The method of claim 7, further comprising forming a third silicon nitride ($Si_xN_y$) thin film on the second silicon nitride thin film, wherein a third composition ratio (x/y) of silicon with respect to nitrogen in the third silicon nitride thin film is in a range of about 0.7 to about 0.85.

11. The method of claim 7, wherein the first and second silicon nitride thin films are formed in-situ.

12. A method of manufacturing a silicon-oxide-nitride-oxide-silicon (SONOS)-type non-volatile semiconductor device, the method comprising:

forming a first oxide layer including silicon oxide on a semiconductor substrate;

forming a silicon nitride ($Si_xN_y$) layer on the first oxide layer by a cyclic CVD process using a silicon source material and a nitrogen source gas, wherein a composition ratio (x/y) of silicon with respect to nitrogen in the silicon nitride layer is in a range of about 0.7 to about 1.5, in which forming the silicon nitride layer comprises introducing the silicon source material in a gaseous state onto the first oxide layer, chemisorbing the silicon source material onto a surface of the first oxide layer, removing residual silicon source material that is not chemisorbed onto the surface of the first oxide layer;

introducing the nitrogen source gas onto the first oxide layer, and forming a preliminary silicon nitride layer by a chemical reaction between the nitrogen source gas and the chemisorbed silicon source material;

forming a second oxide layer on the silicon nitride layer;

forming a conductive layer on the second oxide layer;

forming a gate structure including a charge-trapping dielectric and a conductive pattern on the charge-trapping dielectric by sequentially etching the conductive layer, the second oxide layer, the silicon nitride layer and the first oxide layer, wherein the charge-trapping dielectric has a multilayer structure in which a first oxide layer pattern, a silicon nitride layer pattern, and a second oxide layer pattern are sequentially formed on the semiconductor substrate; and forming source/drain regions at surface portions of the semiconductor substrate adjacent to the gate structure.

13. The method of claim 12, wherein the composition ratio (x/y) of silicon with respect to nitrogen in the silicon nitride layer is in a range of about 0.85 to about 1.5.

14. The method of claim 12, wherein the silicon source material comprises one of hexachlorodisilane ($Si_2Cl_6$) and octachlorotrisilane ($Si_3Cl_8$), and wherein the nitrogen source gas comprises one of ammonia ($NH_3$) gas, amine ($RNH_2$) gas, and a mixture thereof, wherein R is an alkyl group.

15. The method of claim 12, wherein the cyclic CVD process is performed at a temperature of about 400° C. to about 700° C.

16. A method of manufacturing a SONOS-type non-volatile semiconductor device, the method comprising:

forming a first oxide layer including silicon oxide on a semiconductor substrate;

forming a first silicon nitride ($Si_aN_b$) thin film on the first oxide layer, wherein a first composition ratio (a/b) of silicon with respect to nitrogen in the silicon nitride layer is in a range of about 0.7 to about 0.85;

forming a second silicon nitride ($Si_cN_d$) thin film on the first nitride thin film by a cyclic CVD process using a silicon source material and a nitrogen source gas, wherein a second composition ratio (c/d) of silicon with respect to nitrogen in the silicon nitride layer is in a range of about 0.85 to about 1.5, in which forming the second silicon nitride thin film comprises introducing the silicon source material in a gaseous state onto the first silicon nitride thin film, chemisorbing the silicon source material onto a surface of the first silicon nitride thin film, removing residual silicon source material that is not chemisorbed onto the surface of the first silicon nitride thin film, introducing the nitrogen source gas onto the first silicon nitride thin film, and forming a preliminary silicon nitride layer by a chemical reaction between the nitrogen source gas and the chemisorbed silicon source material;

forming a second oxide layer on the second silicon nitride thin film;

forming a conductive layer on the second oxide layer;

forming a gate structure including a charge-trapping dielectric and a conductive pattern on the charge-trapping dielectric by sequentially etching the conductive layer, the second oxide layer, the silicon nitride layer and the first oxide layer, wherein the charge-trapping dielectric has a multilayer structure in which a first oxide layer pattern, a silicon nitride layer pattern and a second oxide layer pattern are sequentially formed on the semiconductor substrate; and forming source/drain regions at surface portions of the semiconductor substrate adjacent to the gate structure by doping impurities onto the substrate adjacent to the gate structure.

17. The method of claim 16, wherein a thickness of the first silicon nitride thin film is about 5% to about 60% of a total thickness of the first and second silicon nitride thin films, and wherein a thickness of the second silicon nitride thin film is about 40% to about 95% of the total thickness of the first and second silicon nitride thin films.

18. The method of claim 16, further comprising forming a third silicon nitride (SixNy) thin film on the second silicon nitride thin film, wherein a third composition ratio (x/y) of silicon with respect to nitrogen in the third silicon nitride thin film is in a range of about 0.7 to about 0.85.

* * * * *